United States Patent
Ebuchi et al.

(10) Patent No.: US 7,233,215 B2
(45) Date of Patent: Jun. 19, 2007

(54) FREQUENCY MODULATION CIRCUIT

(75) Inventors: Tsuyoshi Ebuchi, Osaka (JP); Takefumi Yoshikawa, Hyogo (JP); Yukio Arima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 49 days.

(21) Appl. No.: 11/000,224

(22) Filed: Dec. 1, 2004

(65) Prior Publication Data

US 2005/0135505 A1    Jun. 23, 2005

(30) Foreign Application Priority Data

Dec. 19, 2003   (JP)   ............. 2003-422652

(51) Int. Cl.
    *H03C 3/00*   (2006.01)
(52) U.S. Cl. ............. 332/117; 327/147; 327/156; 331/45; 331/74
(58) Field of Classification Search ............. 332/117; 327/147, 156; 331/45, 74
    See application file for complete search history.

(56) References Cited

U.S. PATENT DOCUMENTS 6,114,914 A * 9/2000 Mar ............. 331/16
6,753,712 B2 * 6/2004 Saeki ............. 327/165
2001/0036239 A1   11/2001 Oka
2002/0079938 A1   6/2002 Saeki

FOREIGN PATENT DOCUMENTS

| CN | 1360396 A | 7/2002 |
| JP | 2001-044826 | 2/2001 |
| JP | 2001-251185 | 9/2001 |

OTHER PUBLICATIONS

Serial ATA Workgroup, "Serial ATA: High Speed Serialized AT Attachment"; Revision 1.0a; Jan. 7, 2003; pp. 83-85.

* cited by examiner

*Primary Examiner*—Robert Pascal
*Assistant Examiner*—Levi Gannon
(74) *Attorney, Agent, or Firm*—McDermott Will & Emery LLP

(57) ABSTRACT

The frequency modulation circuit includes: a phase shift section for receiving a multiphase clock signal composed of a plurality of clock signals having a predetermined phase difference therebetween and shifting the phase of the multiphase clock signal; a clock selection section for selecting a clock signal constituting the multiphase clock signal output from the phase shift section; and a modulation control section for controlling the phase shift section and the clock selection section so that a clock signal having a frequency different from the frequency of the multiphase clock signal input into the phase shift section is output from the clock selection section.

11 Claims, 20 Drawing Sheets

I1+I2=Const

| | PICTRL3 | PICTRL2 | PICTRL1 | NPICTRL3 | NPICTRL2 | NPICTRL1 | Phase Shift(ps) |
|---|---|---|---|---|---|---|---|
| Code1 | 0 | 0 | 0 | 1 | 1 | 1 | 0 |
| Code2 | 0 | 0 | 1 | 1 | 1 | 0 | 25 |
| Code3 | 0 | 1 | 0 | 1 | 0 | 1 | 50 |
| Code4 | 0 | 1 | 1 | 1 | 0 | 0 | 75 |
| Code5 | 1 | 0 | 0 | 0 | 1 | 1 | 100 |
| Code6 | 1 | 0 | 1 | 0 | 1 | 0 | 125 |
| Code7 | 1 | 1 | 0 | 0 | 0 | 1 | 150 |
| Code8 | 1 | 1 | 1 | 0 | 0 | 0 | 175 |

(i)  $0 < t < 0.5/fm$    $f = (1-\delta)fnom + 2fm \cdot \delta \cdot fnom \cdot t$
(ii) $0.5/fm < t < 1/fm$  $f = (1+\delta)fnom - 2fm \cdot \delta \cdot fnom \cdot t$

FREQUENCY MODULATION CIRCUIT

CROSS-REFERENCE TO RELATED APPLICATIONS

This application claims priority under 35 U.S.C. §119 on Patent Application No. 2003-422652 filed in Japan on Dec. 19, 2003, the entire contents of which are hereby incorporated by reference.

BACKGROUND OF THE INVENTION

The present invention relates to a frequency modulation circuit, and more particularly, to a frequency modulation circuit that can perform frequency modulation accurately when the percentage modulation is small.

In interface standards typified by Serial ATA, spread spectrum clocking (SSC) is recommended for reducing electromagnetic interference (EMI) (see Serial ATA Workgroup, "Serial ATA: High Speed Serialized AT Attachment", Revision 1.0a, Jan. 7, 2003, pp. 83–85).

FIG. 18A is a graph showing a change in clock frequency under SSC in a Serial ATA standard. FIG. 18B shows a spectrum of a clock signal under SSC in the Serial ATA standard. The SSC is a technique of modulating the frequency of a clock signal output from a clock source so as to have a predetermined percentage modulation ($\delta=0.5\%$) and a predetermined modulation period (fm=30 kHz to 33 kHz), as shown in FIG. 18A, to thereby reduce the peak value of the spectrum.

The spectrum of a clock signal under SSC is defined to have a frequency component lower than the frequency of a clock signal obtained when no SSC is performed, as shown in FIG. 18B. Also, the peak value of the spectrum of a clock signal under SSC is recommended to be smaller by at least 7 dB than that obtained when no SSC is performed.

As methods for implementing SSC, a division ratio switch method and a direct modulation method are known. These methods will be briefly described in the context of using a phase locked loop (PLL).

FIG. 19 is a block diagram of a frequency modulation circuit adopting the division ratio switch method. The frequency modulation circuit of FIG. 19 includes a frequency phase comparison circuit (PFD) 902, a charge pump circuit (CP) 904, a filter (LPF) 906, a voltage-controlled oscillation circuit (VCO) 908, a frequency division circuit (FD) 912 and a division ratio switch circuit 914.

In the illustrated frequency modulation circuit, the frequency division circuit 912 is configured to be able to perform frequency division with a plurality of division ratios. The frequency division circuit 912 performs switching among the plurality of division ratios with time according to a control signal output from the division ratio switch circuit 914, to thereby change the frequency of an output signal CKOUT of the VCO 908 (see Japanese Laid-Open Patent Publication No. 2000-209033 (FIG. 1) and No. 2001-251185, for example).

FIG. 20 is a block diagram of a frequency modulation circuit adopting the direct modulation method. The frequency modulation circuit of FIG. 20 includes a frequency division circuit 932 and a modulation signal generation circuit 934, in place of the frequency division circuit 912 and the division ratio switch circuit 914 of the frequency modulation circuit of FIG. 19.

In the frequency modulation circuit of FIG. 20, a modulation signal output from the modulation signal generation circuit 934 is given to the VCO 908 as its control voltage, to thereby change the frequency of the output signal CKOUT of the VCO 908 (see Japanese Laid-Open Patent Publication No. 2001-44826 (FIG. 1), for example).

Both the frequency modulation circuits described above perform the frequency modulation within the PLL. If variations exist in the characteristics of the PLL, therefore, such variations affect the output of the frequency modulation circuit, resulting in that the spectrum of the clock signal tends to be deviated from the standard.

In particular, for a high-frequency clock signal, it is conventionally impossible to perform stably frequency modulation with such a small percentage modulation as is defined in Serial ATA standards. Also, it is difficult to design a PLL permitting such modulation. Moreover, in the frequency modulation circuit adopting the division ratio switch method, setting of a small percentage modulation is difficult when the division ratio of the frequency division circuit is small.

SUMMARY OF THE INVENTION

An object of the present invention is providing a frequency modulation circuit capable of performing stable, accurate frequency modulation even when a small percentage modulation is required.

The frequency modulation circuit of the present invention includes: a phase shift section for receiving a multiphase clock signal composed of a plurality of clock signals having a predetermined phase difference therebetween, shifting the phase of the multiphase clock signal, and outputting the resultant signal; a clock selection section for selecting a clock signal constituting the multiphase clock signal output from the phase shift section and outputting the selected signal; and a modulation control section for controlling the phase shift section and the clock selection section so that a clock signal having a frequency different from the frequency of the multiphase clock signal input into the phase shift section is output from the clock selection section.

According to the invention described above, a frequency-modulated clock signal can be output. In particular, a clock signal frequency-modulated with a small percentage modulation can be output stably. The clock signal obtained is free from being affected by loop constants such as the bandwidth of a PLL, unlike the case of performing modulation within a PLL. Therefore, the characteristics of the clock signal are prevented from deviating from the intended characteristics due to variations in circuit characteristics.

In the frequency modulation circuit described above, the clock signal output from the clock selection section preferably changes its frequency at a predetermined period.

In the frequency modulation circuit described above, the phase shift section preferably shifts the phase of the input multiphase clock signal by interpolating a phase between clock signals constituting the multiphase clock signal.

Preferably, the phase shift section has a current source, and shifts the phase of the input multiphase clock signal according to the magnitude of a current flowing through the current source.

In the frequency modulation circuit described above, the modulation control section preferably operates according to a frequency-modulated clock signal.

The modulation control section preferably uses a signal based on the clock signal output from the clock selection section as the frequency-modulated clock signal.

Preferably, the frequency modulation circuit described above further includes a frequency divider for dividing the frequency of the clock signal output from the clock selection section and outputting the resultant signal.

Preferably, a plurality of frequency dividers are provided for dividing the frequency of the clock signal output from the clock selection section with different division ratios and outputting the resultant signals.

Preferably, the frequency modulation circuit described above further includes a selector for selecting one of the outputs of the plurality of frequency dividers according to a signal input from outside the frequency modulation circuit, and outputting the selected signal.

Preferably, the frequency modulation circuit described above further includes a register for holding a written value, wherein the selector selects one of the outputs of the plurality of frequency dividers based on the value in the register.

Preferably, the frequency modulation circuit described above further includes a phase locked loop receiving a signal based on the clock signal output from the clock selection section as an input.

As described above, according to the present invention, in Serial ATA and the like in which frequency modulation with a small percentage modulation is required, modulation can be performed outside a PLL, and thus stable, accurate frequency modulation can be attained.

DESCRIPTION OF THE PREFERRED EMBODIMENTS

Hereinafter, a preferred embodiment of the present invention will be described with reference to the accompanying drawings.

Figure 1:
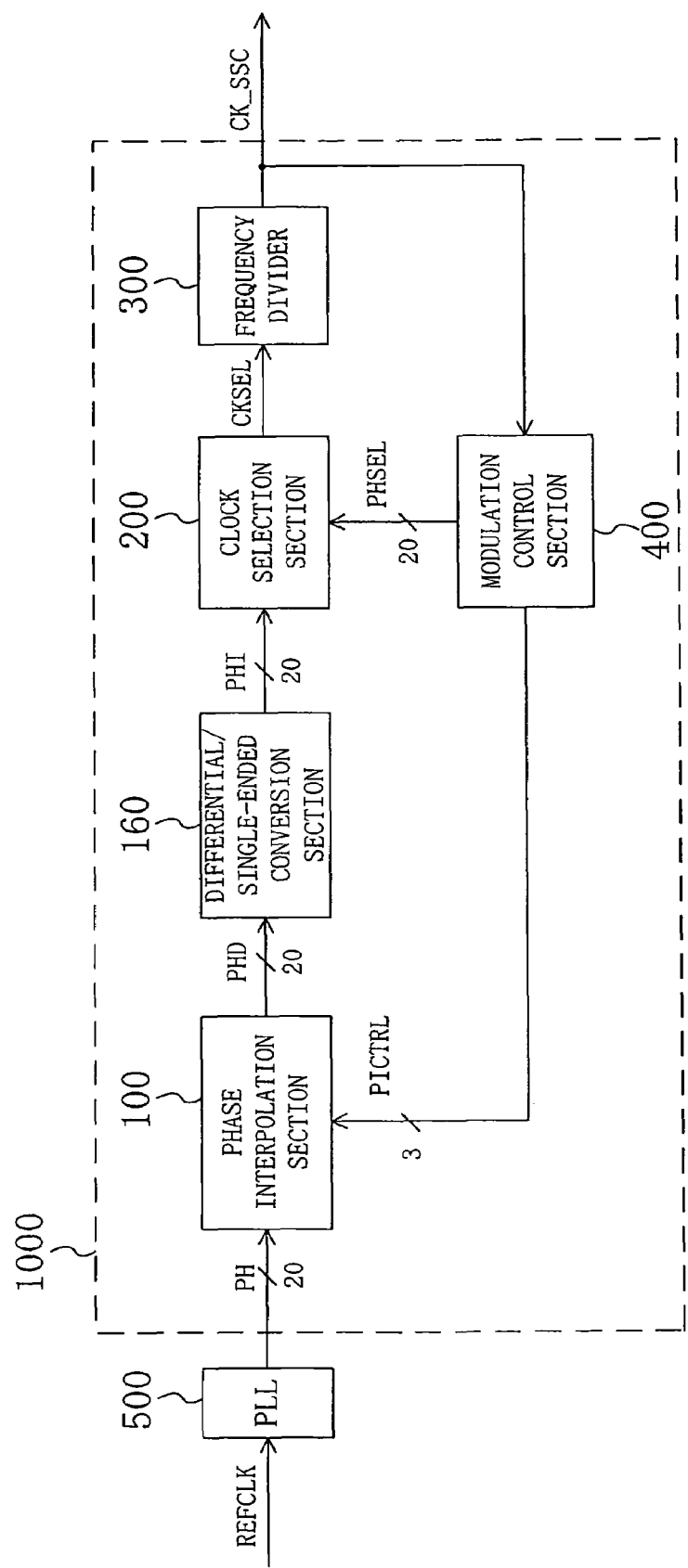
FIG. 1 is a block diagram showing an example of a frequency modulation circuit of an embodiment of the present invention.

FIG. 1 is a block diagram showing a frequency modulation circuit of an embodiment of the present invention. The configuration shown in FIG. 1 includes a phase locked loop (PLL) 500 and a frequency modulation circuit 1000. The frequency modulation circuit 1000 includes a phase interpolation section 100 as the phase shift section, a differential/single-ended conversion section 160, a clock selection section 200, a frequency divider 300 and a modulation control section 400. The PLL 500 generates, based on a 25 MHz reference clock signal REFCLK, a multiphase clock signal PH having a frequency ten times as high as that of the reference clock signal REFCLK, and outputs the generated clock signal PH to the phase interpolation section 100.

The multiphase clock signal PH is composed of clock signals PH1, PH2, PH3, and PH20 different in phase by π/10 each. The clock signals PH1 to PH20 are differential signals, and the clock signals PH11 to PH20 are phase-inverted ones of the clock signals PH1 to PH10, respectively. Therefore, the multiphase clock PH can be transmitted via a total of 20 signal lines. This also applies to other differential multiphase clock signals.

The phase interpolation section 100 shifts the phase of the multiphase clock signal PH according to a phase control signal PICTRL output from the modulation control section 400, and outputs the resultant multiphase clock signal PHD to the differential/single-ended conversion section 160. The differential/single-ended conversion section 160 converts the differential signals constituting the multiphase clock signal PHD to single-ended signals, and outputs the resultant multiphase clock signal PH1 to the clock selection section 200.

The clock selection section 200 selects one from the clock signals constituting the multiphase clock signal PH1 according to a clock selection signal PHSEL output from the modulation control section 400, and outputs the selected clock signal CKSEL to the frequency divider 300. The clock signal CKSEL, which is different in frequency from the multiphase clock signal PH, is a signal frequency-modulated from a clock signal constituting the multiphase clock signal PH.

The frequency divider 300 divides the frequency of the clock signal CKSEL by 10, and outputs the resultant clock signal CK_SSC to the modulation control section 400 and also outputs outside the frequency modulation circuit 1000. The frequency control circuit 400 generates the phase control signal PICTRL and the clock selection signal PHSEL according to the clock signal CK_SSC, and outputs the signals PICTRL and PHSEL to the phase interpolation section 100 and the clock selection section 200, respectively.

Figure 2A:
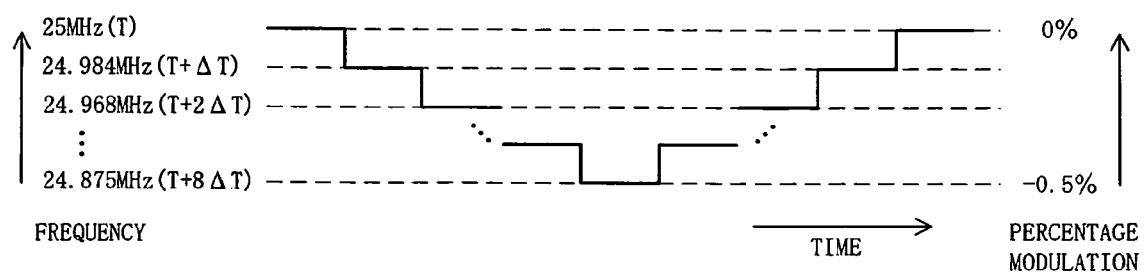
FIG. 2A is a graph showing a change in the frequency of a clock signal CK_SSC output from the frequency modulation circuit in FIG. 1.

FIG. 2A is a graph showing a change in the frequency of the clock signal CK_SSC output from the frequency modulation circuit 1000 in FIG. 1. The frequency modulation circuit 1000 modulates the frequency of the multiphase clock signal PH, and outputs the frequency-modulated clock signal CK_SSC. For example, as in FIG. 2A, the frequency modulation circuit 1000 repeats changing the frequency of the clock signal CK_SSC in steps of 0.0625% each from 25 MHz (percentage modulation: 0%) to 24.984 MHz (percentage modulation: −0.0625%), 24.968 MHz (percentage modulation: −0.125%), . . . , 24.875 MHz (percentage modulation: −0.5%), . . . , 24.968 MHz (percentage modulation: −0.125%), 24.984 MHz (percentage modulation: −0.0625%), and 25 MHz (percentage modulation: 0%).

Figure 2B:
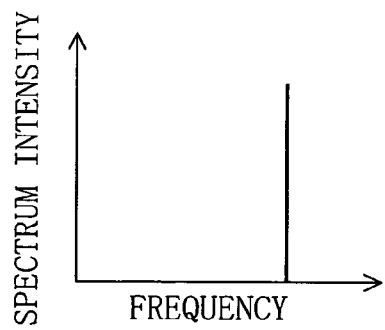
FIG. 2B is a graph showing the spectrum of a clock signal having a constant frequency.
Figure 2C:
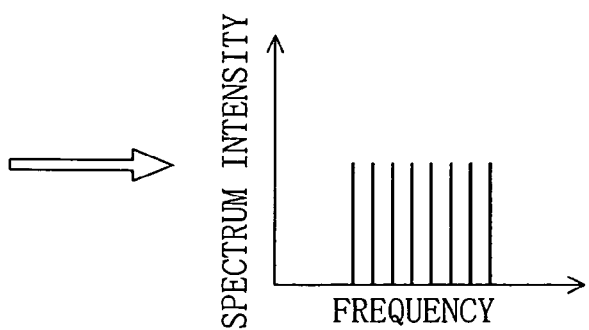
FIG. 2C is a graph showing the spectrum of a clock signal frequency-modulated as shown in FIG. 2A.

FIG. 2B is a graph showing the spectrum of a clock signal having a constant frequency, and FIG. 2C is a graph showing the spectrum of a clock signal frequency-demodulated as shown in FIG. 2A. Since the frequency modulation circuit 1000 changes the frequency of the output clock signal CK_SSC, the peak value of the spectrum intensity of the clock signal CK_SSC can be reduced as shown in FIG. 2C.

In FIG. 2A, the frequency of the clock signal CK_SSC is changed in eight steps. Alternatively, the frequency may be changed in 16 steps, 32 steps and the like, for example. As the number of steps of the change is greater, the shape of the graph showing the temporal change of the frequency is closer to a triangular wave, indicating that the effect of reducing the peak value of the spectrum intensity is greater. Although the number of steps of the change of the frequency can be easily increased, the case of changing the frequency of the clock signal CK_SSC in eight steps will be herein described for simplification of the description.

Figure 3:
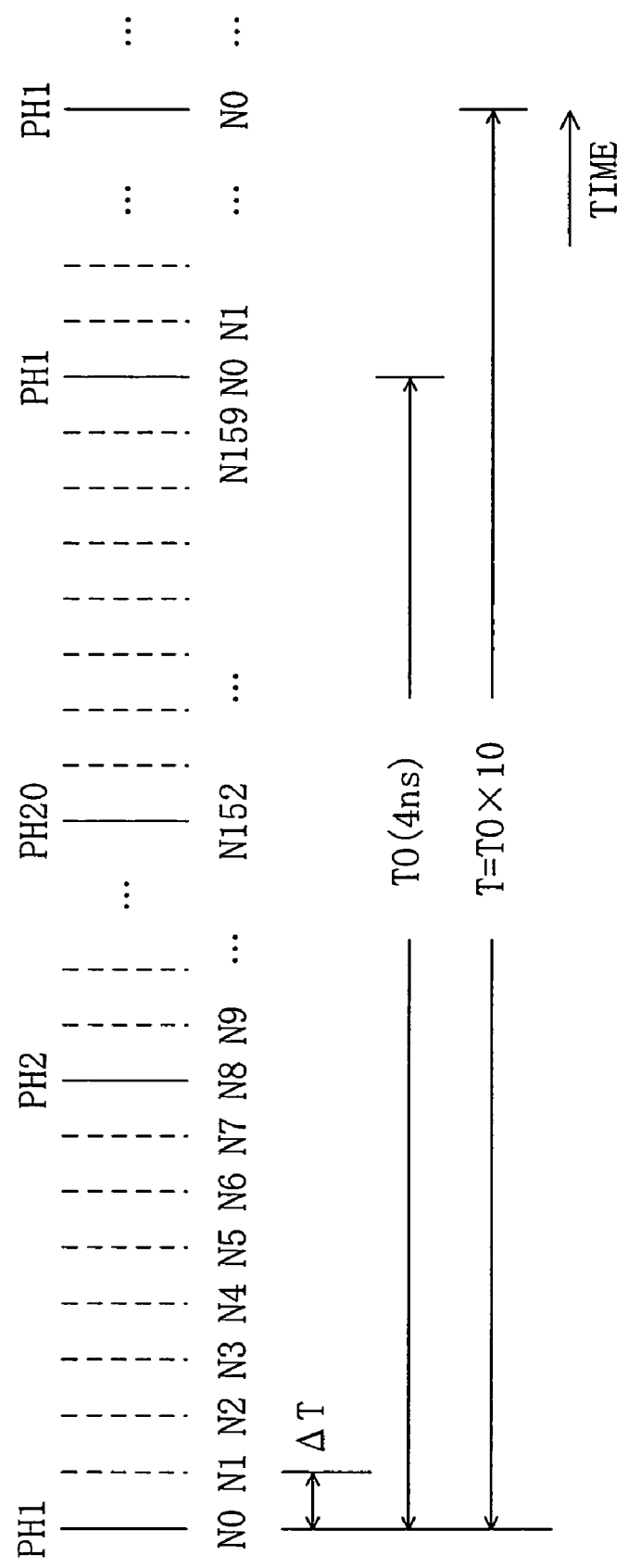
FIG. 3 is a view illustrating the positions of the rising edges of clock signals constituting a multiphase clock signal input into a phase interpolation section in FIG. 1.

FIG. 3 is a view illustrating the positions of the rising edges of the clock signals constituting the multiphase clock signal input into the phase interpolation section 100 in FIG. 1. In this embodiment, each of the clock signals PH1 to PH20 has a period T0 (4 ns). The clock signals PH2 to PH20 are respectively delayed behind the clock signal PH1 by T0/20, 2·T0/20, 3·T0/20, . . . , and 19·T0/20.

Assume that clock signals delayed in phase behind the clock signal PH1 by ΔT (=T0/160=25 ps), 2ΔT, 3ΔT, . . . , and 159ΔT are called clock signals N1, N2, N3, . . . , and N159. Then, the clock signals PH2 to PH20 respectively correspond to the clock signals N8, N16, . . . , and N152. The clock signal PH1 is also called a clock signal N0.

Figure 4:
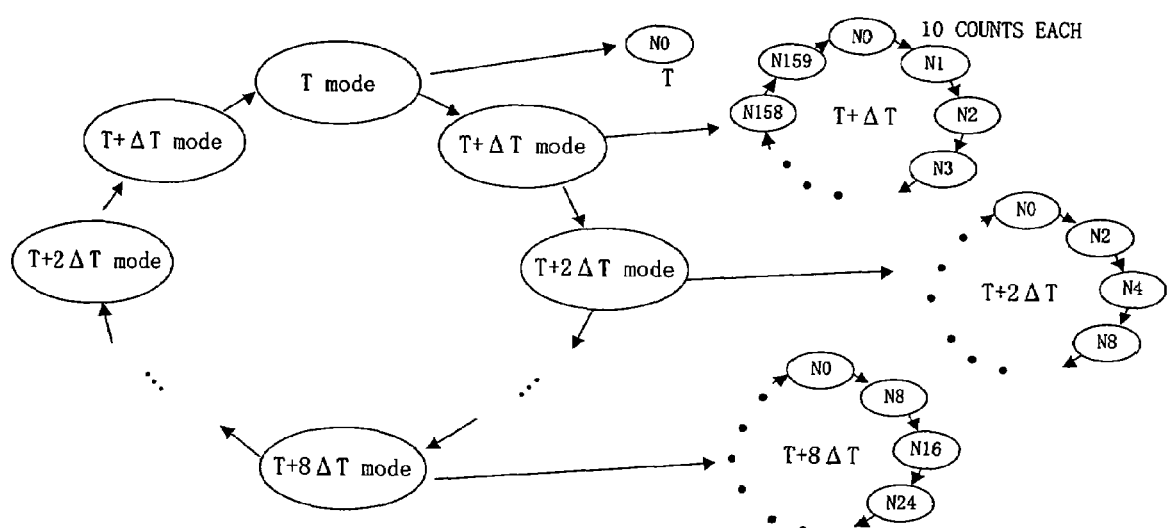
FIG. 4 is a state transition diagram of the frequency modulation circuit in FIG. 1.

FIG. 4 is a state transition diagram of the frequency modulation circuit 1000 in FIG. 1. The frequency modulation circuit 1000 repeats changing its state in the order of T mode, T+ΔT mode, T+2ΔT mode, T+3ΔT mode, T+4ΔT mode, T+5ΔT mode, T+6ΔT mode, T+7ΔT mode, T+8ΔT mode, T+7ΔT mode, T+6ΔT mode, T+5ΔT mode, T+4ΔT mode, T+3ΔT mode, T+2ΔT mode, T+ΔT mode, and T mode, as shown in FIG. 4. Each mode corresponds to each frequency shown in FIG. 2A.

In the T mode, the clock selection section 200 selects the clock signal N0. In the T+ΔT mode, the clock selection section 200 repeats selecting the clock signals N0, N1, N2, . . . , N159 sequentially by ten times each. In the T+2ΔT mode, the clock selection section 200 repeats selecting the clock signals N0, N2, N4, . . . , N158 sequentially by ten times each. In the T+3ΔT mode, the clock selection section 200 repeats selecting the clock signals N0, N3, N6, . . . , N157 sequentially by ten times each. In the T+4ΔT mode, the clock selection section 200 repeats selecting the clock signals N0, N4, N8, . . . , N156 sequentially by ten times each. In the T+5ΔT mode, the clock selection section 200 repeats selecting the clock signals N0, N5, N0, . . . , N155 sequentially by ten times each. In the T+6ΔT mode, the clock selection section 200 repeats selecting the clock signals N0, N6, N12, . . . , N154 sequentially by ten times each. In the T+7ΔT mode, the clock selection section 200 repeats selecting the clock signals N0, N7, N14, . . . , N153 sequentially by ten times each. In the T+8ΔT mode, the clock selection section 200 repeats selecting the clock signals N0, N8, N16, . . . , N152 sequentially by ten times each.

Figure 5:
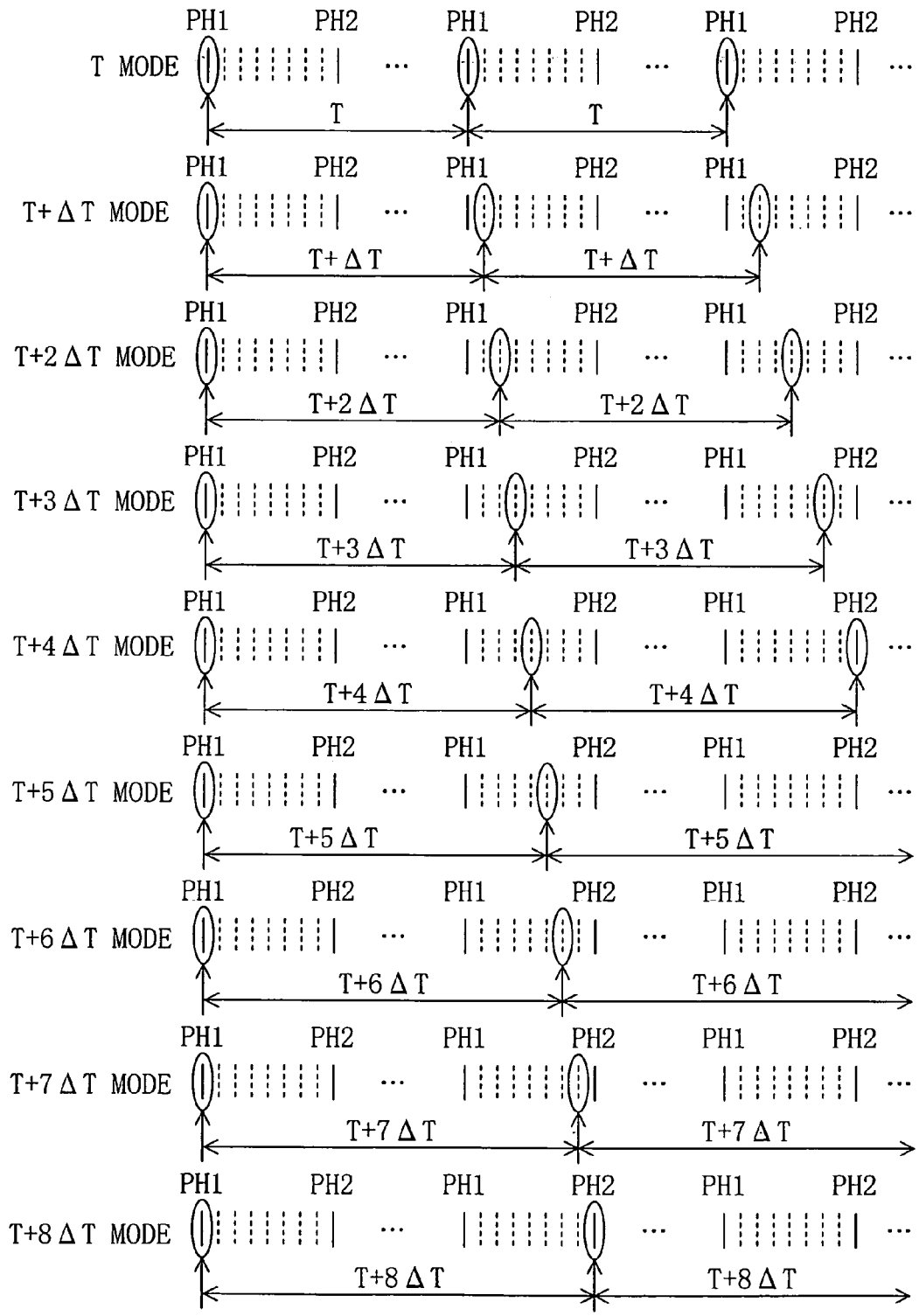
FIG. 5 is a view illustrating the positions of the edges of clock signals selected by a clock selection section in FIG. 1.

FIG. 5 shows a view illustrating the positions of the edges of the clock signals selected by the clock selection section 200 in FIG. 1. In FIG. 5, one every ten positions of the selected edges is shown. The period T is the period (40 ns) of the clock signal output from the frequency divider 300 in the T mode. Since the clock signal selected by the clock selection section 200 is frequency-divided by 10 by the frequency divider 300, the period of the clock signal output from the frequency divider 300 is different among the modes by T/1600 (=25 ps) each. Thus, the frequency modulation circuit in FIG. 1 can perform frequency modulation with a percentage modulation below 0.5% although the phase difference between clock signals constituting a multiphase clock signal is the 1/20 period.

Figure 6A:
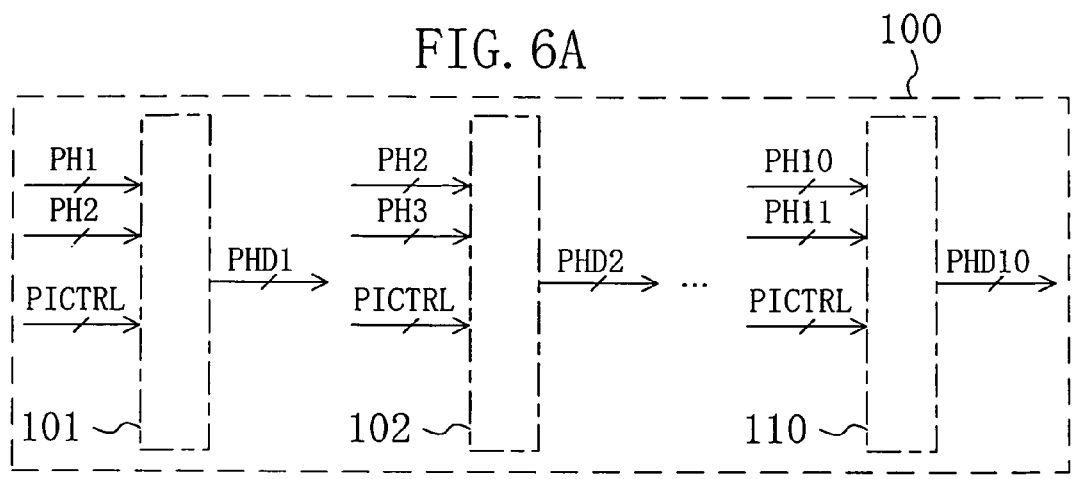
FIG. 6A is a block diagram of the phase interpolation section in FIG. 1.

FIG. 6A is a block diagram of the phase interpolation section 100 in FIG. 1. As shown in FIG. 6A, the phase interpolation section 100 includes ten phase interpolators 101, 102, . . . , 110 having substantially the same configuration. The phase interpolator 101 receives the clock signals PH1 and PH2, generates a clock signal PHD1 having a phase somewhere between the phases of the received clock signals according to the phase control signal PICTRL, and outputs the resultant signal. The subsequent phase interpolators 102 to 110 sequentially receive the clock signals delayed by T0/20 behind the preceding clock signals. For example, the phase interpolator 102 generates a clock signal PHD2 from the clock signals PH2 and PH3 as the inputs, and the phase interpolator 110 generates a clock signal PHD10 from the clock signals PH10 and PH11 as the inputs.

As described above, the phase interpolators 101 to 110 respectively generate clock signals PHD1 to PHD10 constituting the multiphase clock signal PHD, which is output to the differential/single-ended conversion section 160.

Figure 6B:
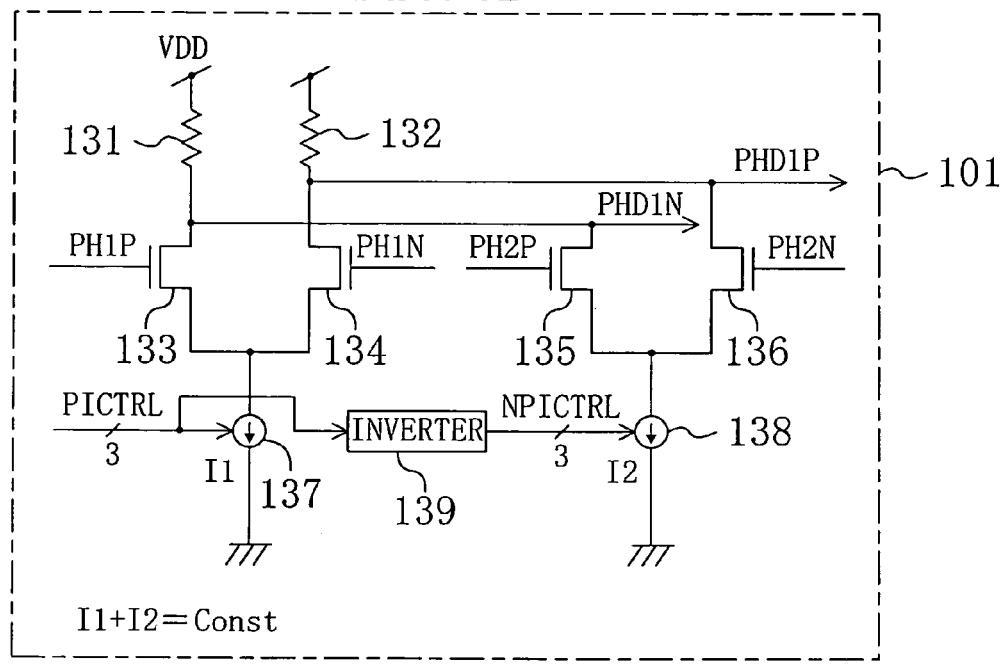
FIG. 6B is a circuit diagram of a phase interpolator in FIG. 6A.

FIG. 6B is a circuit diagram of the phase interpolator 101 of FIG. 6A. The phase interpolator 101 includes resistances 131 and 132, NMOS transistors 133, 134, 135 and 136, current sources 137 and 138, and an inverter 139.

The NMOS transistors 133 and 134 constitute a differential switch, and the NMOS transistors 135 and 136 constitute another differential switch. Signals PH1P and PH1N constitute the clock signal PH1, and signals PH2P and PH2N constitute the clock signal PH2. The clock signals PHD1 to PHD10 are differential signals, and the signals PHD1P and PHD1N, for example, constitute the clock signal PHD1. The clock signal PHD1 has a phase somewhere between the phases of the clock signals PH1 and PH2.

Figure 6C:
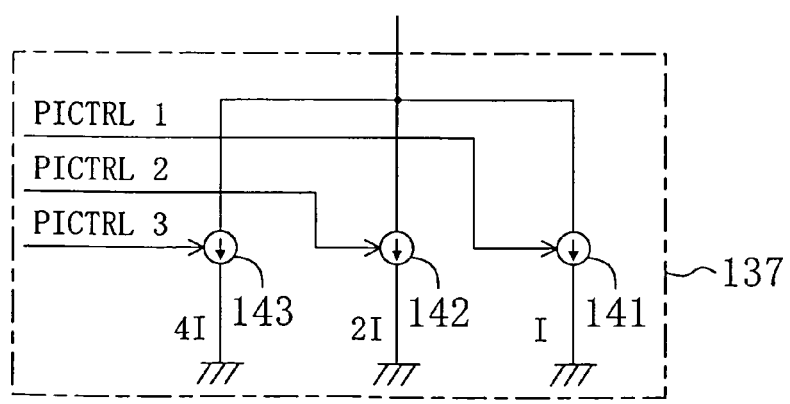
FIG. 6C is a circuit diagram of a current source 137 in FIG. 6B.

FIG. 6C is a circuit diagram of the current source 137 in FIG. 6B. The current source 137 has current sources 141, 142 and 143, which are respectively controlled with phase control signals PICTRL1, PICTRL2 and PICTRL 3 constituting the 3-bit phase control signal PICTRL and output currents I, 2I and 4I when the corresponding control signals are high, for example. In other words, the current source 137 can control a current I1 in eight steps. The current source 138 is also configured as described above except for being controlled with a phase control signal NPICTRL.

The phase interpolator 101 is a typical current-differential phase interpolator, in which the clock signals PH1 and PH2 are weighted by changing the ratio between the currents I1 and I2 output from the current sources 137 and 138, to thereby change the phase of the clock signal PHD1. The inverter 139 in FIG. 6B inverts the logical levels of the bits of the 3-bit phase control signal PICTRL, and outputs the results to the current source 138 as phase control signals NPICTRL1, NPICTRL2 and NPICTRL3 constituting the phase control signal NPICTRL. Thus, the sum of the currents I1 and I2 output from the current sources 137 and 138 is controlled to be constant.

Since the current sources 137 and 138 can control the currents I1 and I2 in eight steps, the phase interpolator 101 can control the phase shift of the clock signal PHD1 with respect to the clock signal PH1 in eight steps (that is, every ΔT=T0/(20·8))=25 ps). Since the phase interpolators 102 to 110 are also controlled with the same phase control signal PICTRL, the phase shift of the multiphase clock signal PHD with respect to the multiphase clock signal PH can be controlled in the same manner.

Figures 7A, 7B:
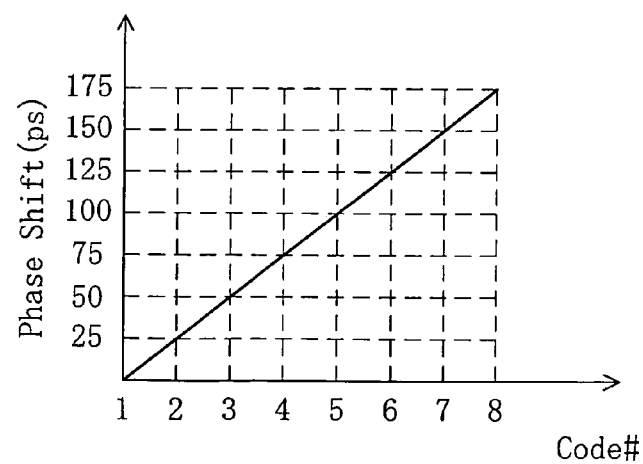
FIG. 7A is a view showing the relationship between the combination of signals constituting a phase control signal input into phase interpolators in FIG. 6A and the phase shift of a clock signal PHD.
FIG. 7B is a graph showing the relationship between the combination and the phase shift of the clock signal PHD shown in FIG. 7A.

FIG. 7A is a view showing the relationship between the combination of the signals constituting the phase control signal PICTRL input into the phase interpolation section 100 of FIG. 6A and the phase shift of the clock signal PHD. FIG. 7B is a graph showing the relationship between the combination and the phase shift of the clock signal PHD shown in FIG. 7A. The phase shift as used herein refers to a delay of the phase of the clock signal PHD with respect to the input clock signal PH.

Figure 8:
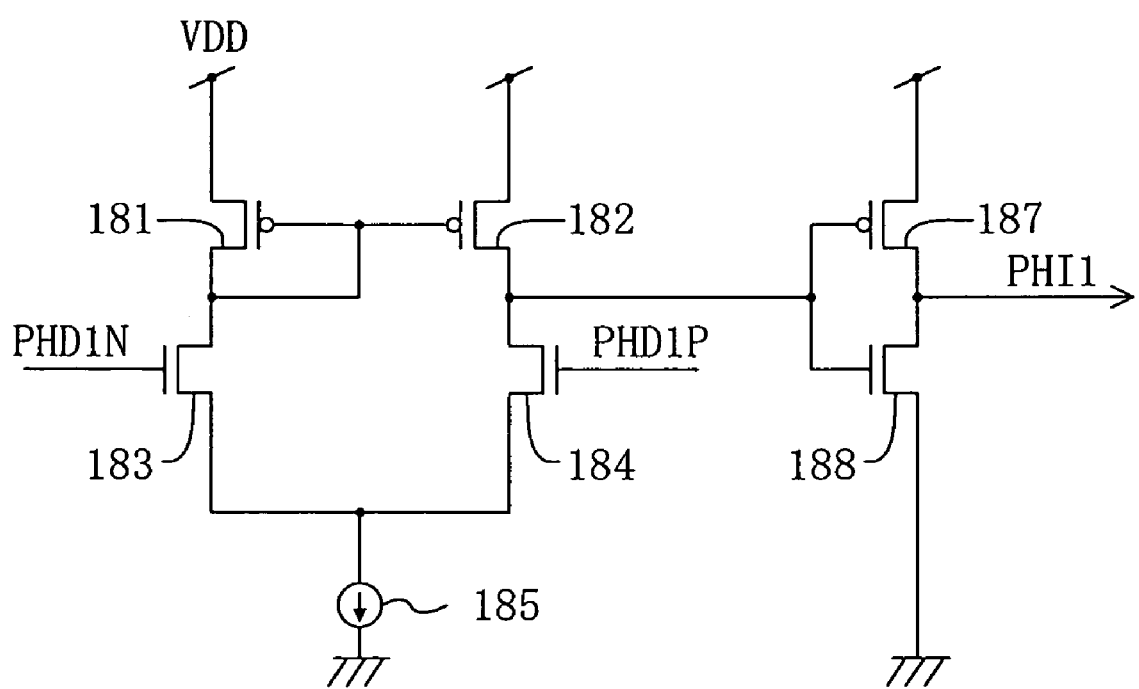
FIG. 8 is a circuit diagram of a differential/single-ended conversion circuit of a differential/single-ended conversion section in FIG. 1.

FIG. 8 is a circuit diagram of a differential/single-ended conversion circuit of the differential/single-ended conversion section 160. The differential/single-ended conversion circuit of FIG. 8, which corresponds to one clock signal PHD1 of the multiphase clock signal PHD, includes PMOS transistors 181, 182 and 187, NMOS transistors 183, 184 and 188, and a current source 185. The differential/single-ended conversion circuit of FIG. 8 receives the differential clock signal PHD1 composed of the signals PHD1P and PHD1N, converts the received signal to a single-ended clock signal PHI1, and outputs the resultant signal to the clock selection section 200.

The differential/single-ended conversion section 160 has a total of 20 circuits having substantially the same configuration as the circuit of FIG. 8, to convert the differential clock signals PHD1 to PHD10 to single-ended clock signals PHI1 to PHI20, respectively, and outputs the resultant signals to the clock selection section 200.

Figure 9:
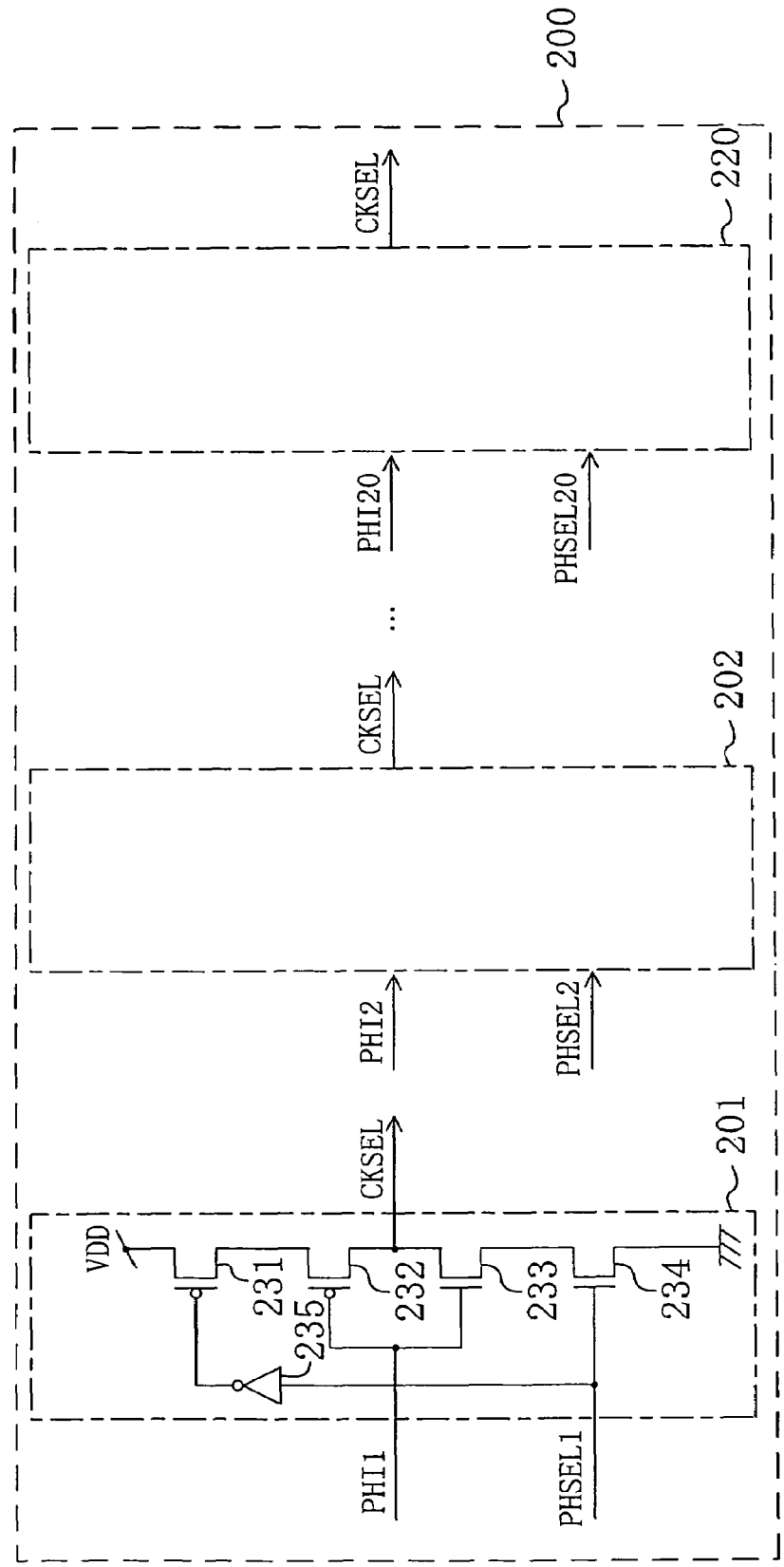
FIG. 9 is a block diagram of the clock selection section in FIG. 1

FIG. 9 is a block diagram of the clock selection section 200 in FIG. 1. The clock selection section 200, which is a typical 20:1 multiplex circuit, has a total of 20 selection circuits 201, 202, . . . , 220 having substantially the same configuration. Clock selection signals PHSEL1 to PHSEL20 constitute the clock selection signal PHSEL.

The selection circuit 201 includes PMOS transistors 231 and 232, NMOS transistors 233 and 234, and an inverter 235. The selection circuit 201 inverts the level of the input clock signal PHI1 when the clock selection signal PHSEL1 is "H" (high potential), and outputs the resultant signal to the frequency divider 300 as the selected clock signal CKSEL. The selection circuits 202 to 220 respectively receive the clock signals PHI2 to PHI20.

In other words, the clock selection section 200 selects one clock signal from the 20-phase clock signal PH1 according to the clock selection signals PHSEL1 to PHSEL20 output from the modulation control section 400, and outputs the selected signal to the frequency divider 300 as the clock signal CKSEL.

The frequency divider 300 in FIG. 1 divides the frequency of the clock signal CKSEL by ten, and outputs the resultant clock signal CK_SSC outside the frequency modulation circuit 1000 and also to the modulation control section 400. The frequency divider 300 can be a well-known 10-divider having a D flipflop, and thus detailed description thereof is omitted here.

The modulation control section 400 generates the phase control signal PICTRL and the clock selection signal PHSEL according to the clock signal CK_SSC, and outputs the phase control signal PICTRL and the clock selection signal PHSEL to the phase interpolation section 100 and the clock selection section 200, respectively.

Figure 10:
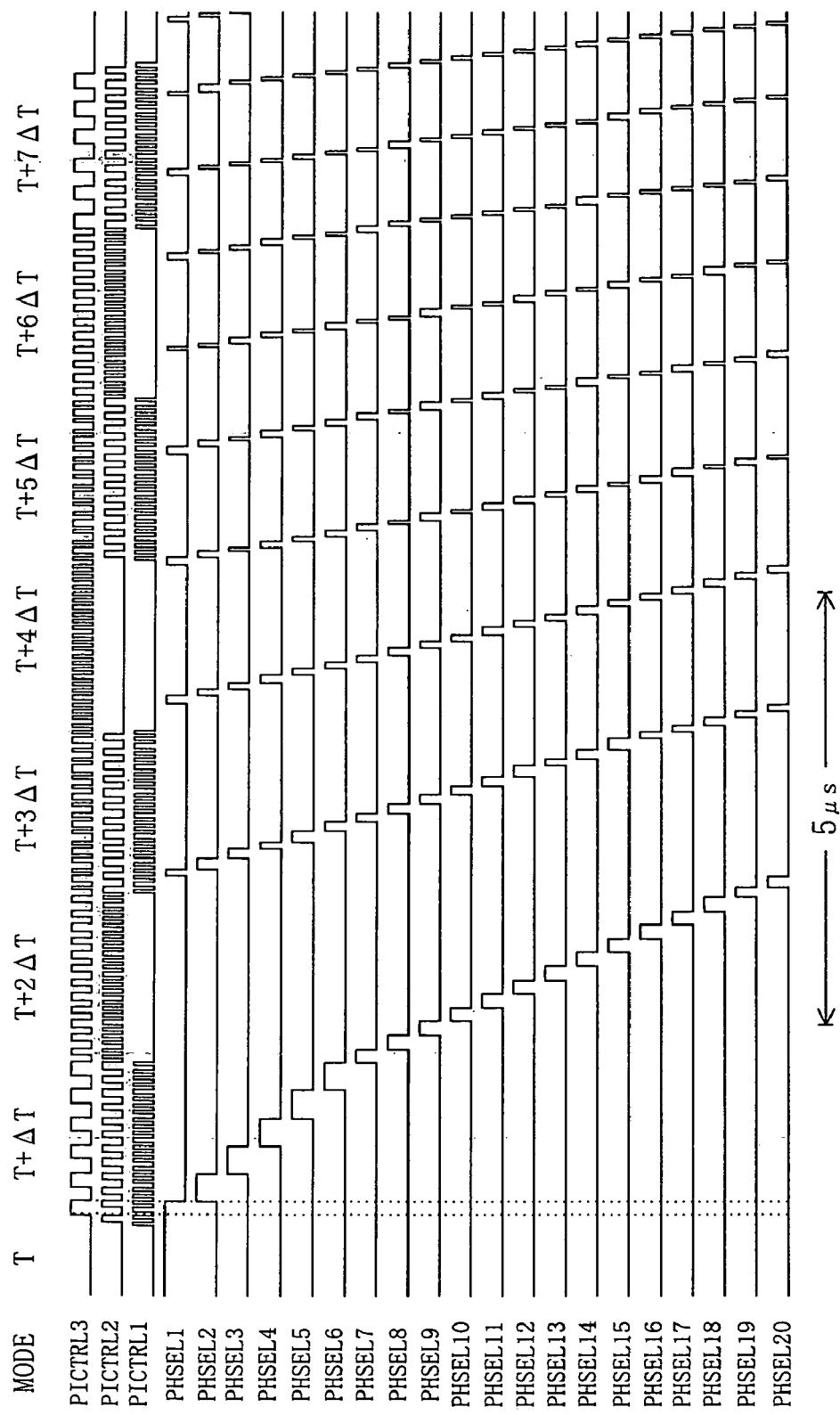
FIG. 10 is a timing chart showing the phase control signal PICTRL and a clock selection signal PHSEL output from a modulation control section in FIG. 1.

FIG. 10 is a timing chart showing the phase control signal PICTRL and the clock selection signal PHSEL output from the modulation control section 400 in FIG. 1. The modulation control section 400, which is a logic circuit, generates the phase control signal PICTRL and the clock selection signal PHSEL so that the phase interpolation section 100 and the clock selection section 200 operate as described above with reference to FIGS. 4 and 5.

FIGS. 11, 12, 13, 14 and 15 are timing charts showing in detail the phase control signal PICTRL and the clock selection signal PHSEL output from the modulation control section 400 in the T mode, the T+ΔT mode, the T+2ΔT mode, the T+3ΔT mode and the T+4ΔT mode, respectively. In these figures, the clock selection signals PHSEL 5 to PHSEL 20 are omitted.

Figure 11:
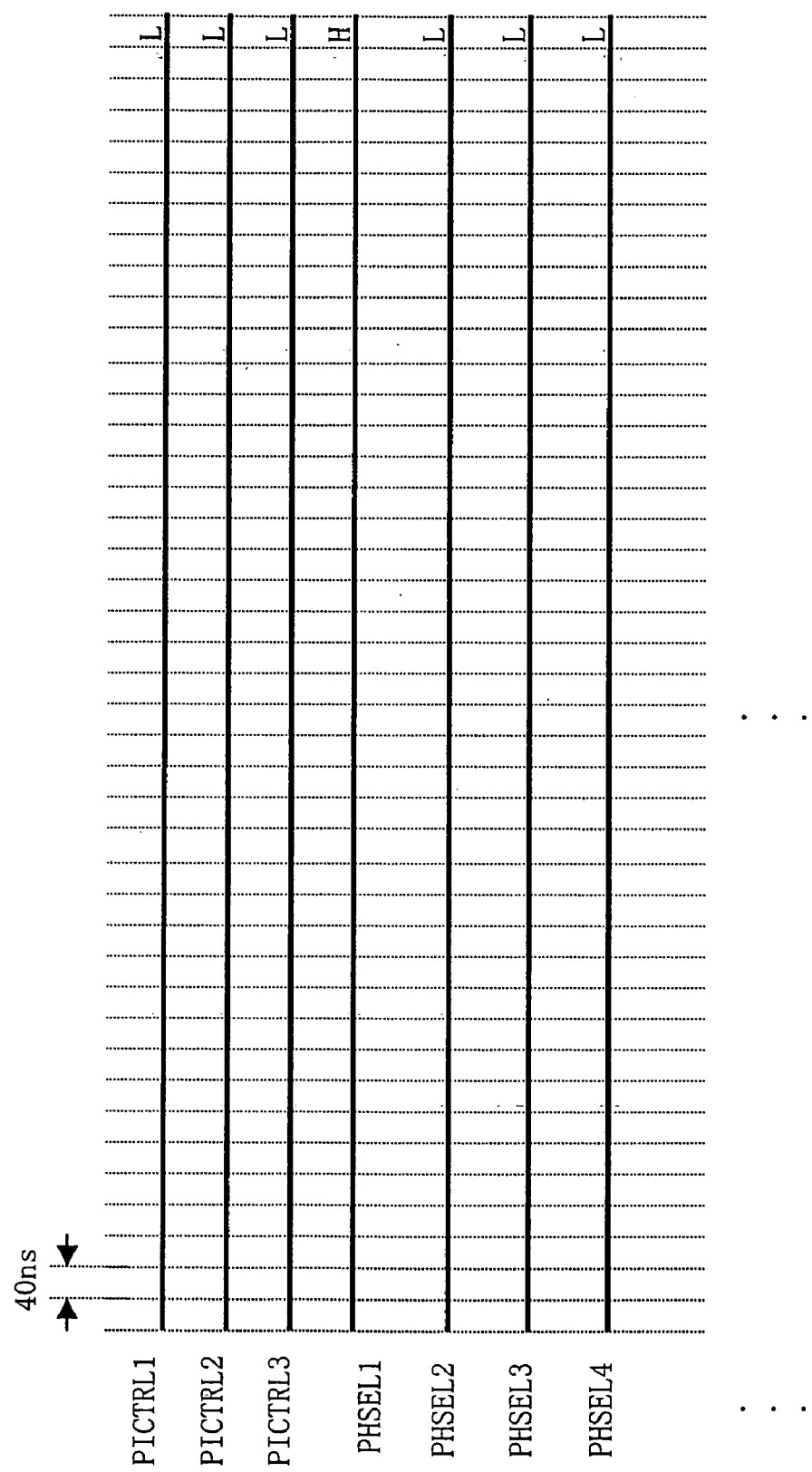
FIG. 11 is a timing chart showing in detail the phase control signal PICTRL and the clock selection signal PHSEL output from the modulation control section, in a T mode.
Figure 12:
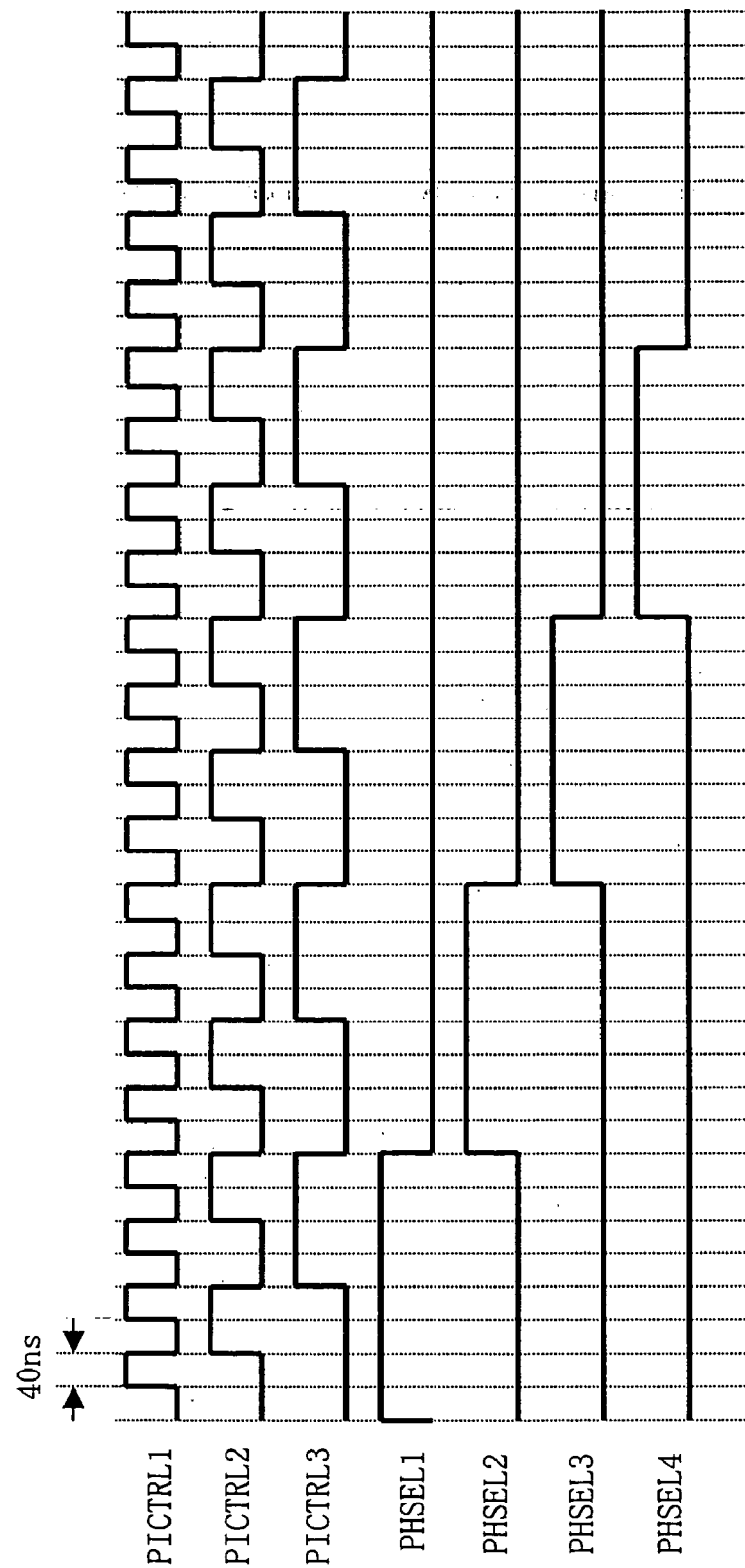
FIG. 12 is a timing chart showing in detail the phase control signal PICTRL and the clock selection signal PHSEL output from the modulation control section, in a T+ΔT mode.
Figure 13:
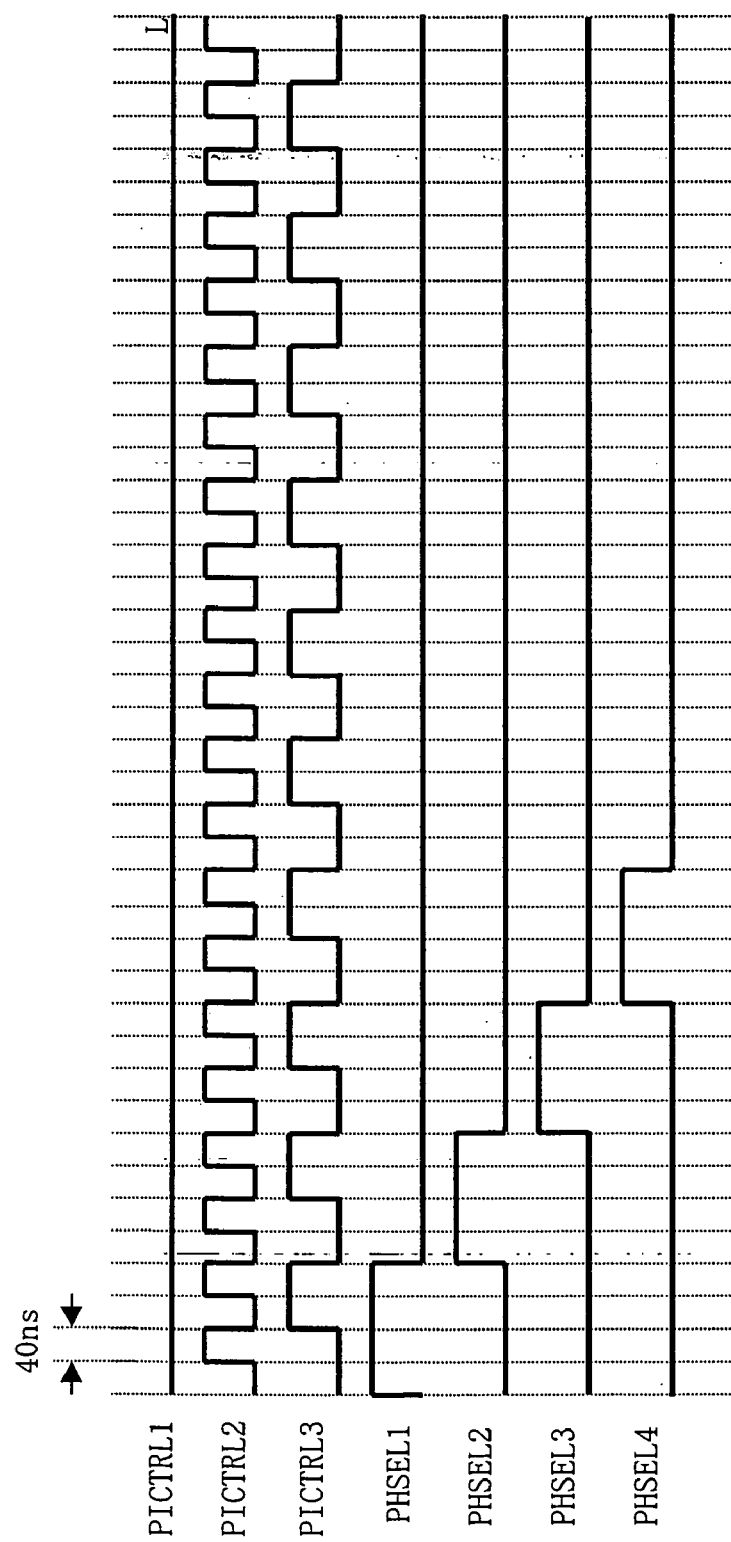
FIG. 13 is a timing chart showing in detail the phase control signal PICTRL and the clock selection signal PHSEL output from the modulation control section, in a T+2ΔT mode.
Figure 14:
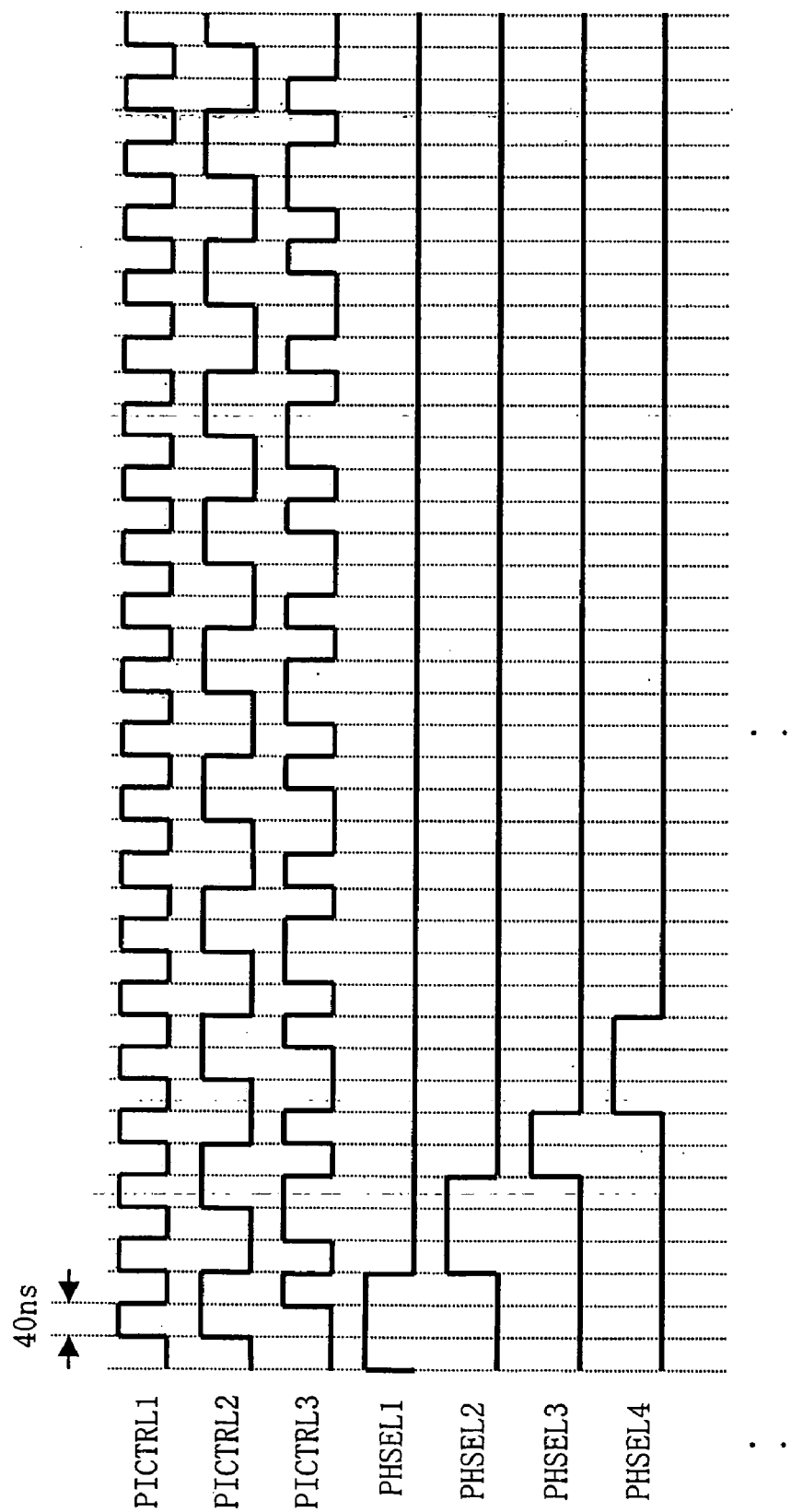
FIG. 14 is a timing chart showing in detail the phase control signal PICTRL and the clock selection signal PHSEL output from the modulation control section, in a T+3ΔT mode.
Figure 15:
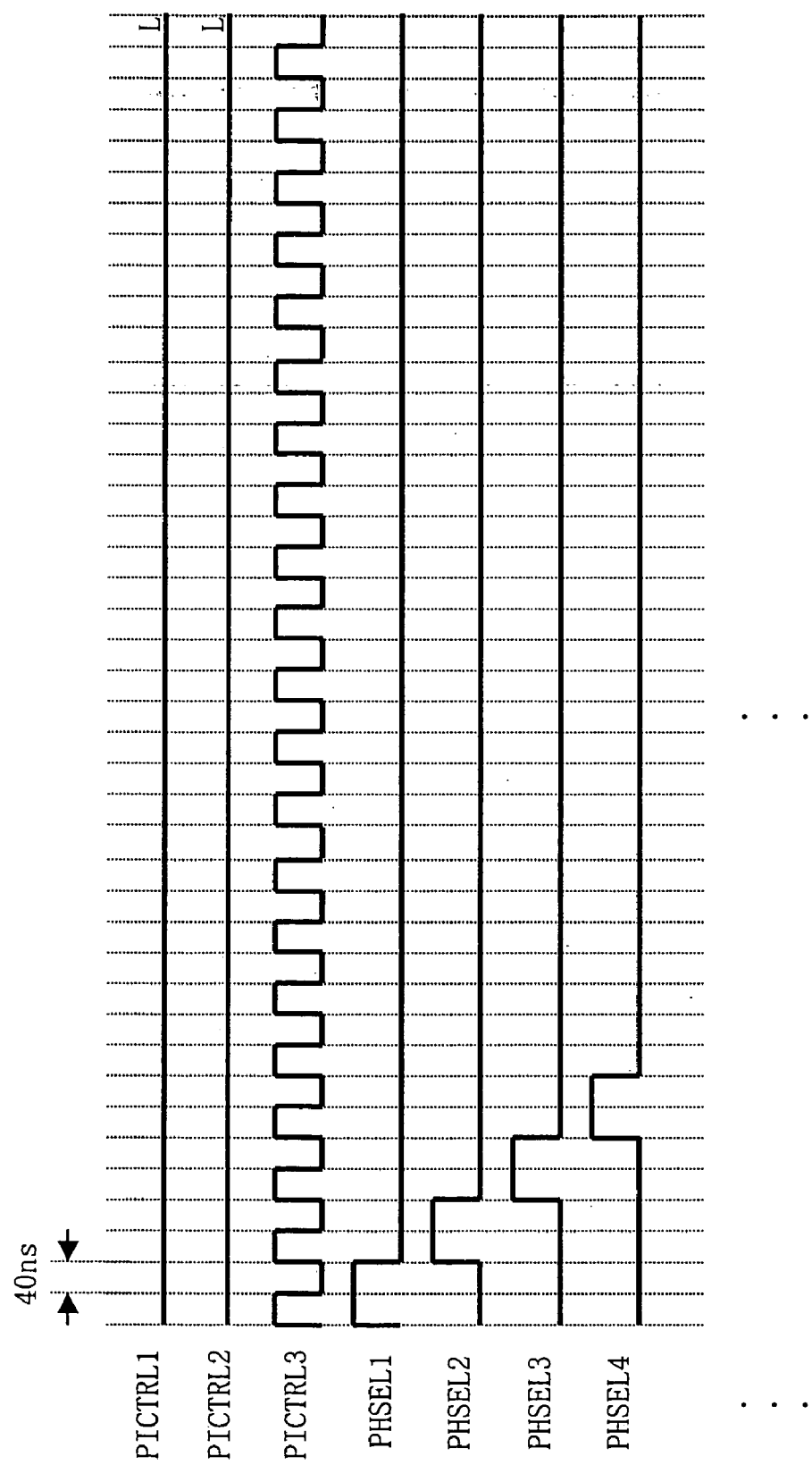
FIG. 15 is a timing chart showing in detail the phase control signal PICTRL and the clock selection signal PHSEL output from the modulation control section, in a T+4ΔT mode.

FIG. 11 shows the signals for outputting the clock signal N0. FIG. 12 shows the signals for outputting the clock signals N0, N1, N2, . . . sequentially ten times each. FIG. 13 shows the signals for outputting the clock signals N0, N2, N4, . . . sequentially ten times each. FIG. 14 shows the signals for outputting the clock signals N0, N3, N6, sequentially ten times each. FIG. 15 shows the signals for outputting the clock signals N0, N4, N8, . . . sequentially ten times each.

Timing charts of the phase control signal PICTRL and the clock selection signal PHSEL in the T+5ΔT mode, the T+6ΔT mode, the T+7ΔT mode and the T+8ΔT mode are omitted here although detailed illustrations are also possible for these modes.

In the frequency modulation circuit 1000 having the above configuration, the clock signal CK_SSC frequency-modulated as shown in FIG. 2A is output from the frequency divider 300. This modulation is done outside the PLL. Therefore, unlike the case of modulating inside the PLL, the resultant clock signal is not affected by loop constants such as the bandwidth of the PLL. Thus, the characteristics of the clock signal are prevented from deviating from the intended characteristics, and also the design of the PLL becomes easy.

The phase interpolation section 100 includes the phase interpolators 101 to 110 for performing phase shift according to the current output from the current source. With this control of the phase shift amount by controlling the current, the accuracy of the phase shift improves, and thus accurate frequency modulation can be obtained. Also, the frequency modulation is less susceptible to variations in characteristics that may occur from the fabrication process and the voltage and temperature during operation.

The modulation control section operates according to a modulated clock signal. If the modulation control section operates according to a clock signal having a constant frequency, a glitch occurs in the clock signal output from the clock selection section 200 depending on the phase relationship between the output of the phase interpolation section and the selection signal, resulting in the possibility of a malfunction of a circuit using this clock signal. To prevent occurrence of a glitch, the modulation control section is made to operate according to the modulated clock signal to thereby substantially maintain synchronization between the output of the phase interpolation section and the selection signal. If no modulated clock signal is used, the modulation control section will be necessary for each phase of the 20-phase clock to substantially maintain the above synchronization, and this increases the circuit size. By use of the modulated clock signal, therefore, the logic circuit constituting the modulation control section can be simplified, and this can reduce the circuit area and the power.

The modulation control section operates according to the modulated clock signal output from the clock selection section. This eliminates the necessity of supplying a modulated clock signal from outside, and thus the circuit can be simplified and the number of components can be reduced.

The frequency divider is placed downstream of the clock selection section. With this placement, the phase shift may be done once every several periods and thereafter the frequency division may be done. Therefore, even if the phase shift done in the phase shift section is comparatively large, the phase shift amount with respect to the period of the clock signal after the division can be reduced. In this way, frequency modulation with a small percentage modulation can be easily attained.

Figure 16:
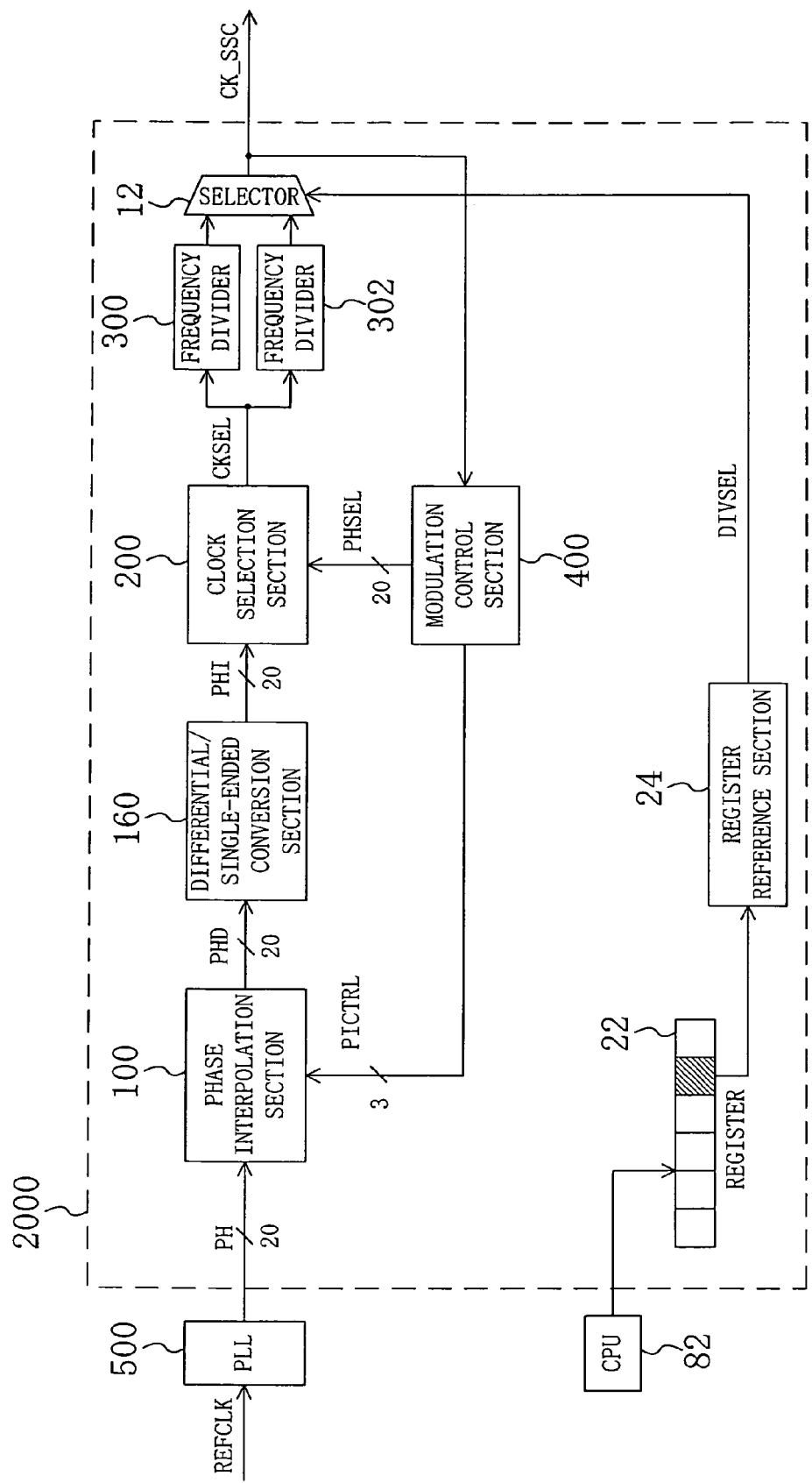
FIG. 16 is a block diagram showing another example of a frequency modulation circuit of the present invention.

FIG. 16 is a block diagram showing another example of a frequency modulation circuit of the present invention. The frequency modulation circuit in FIG. 16 includes a frequency divider 302, a selector 12, a register 22 and a register reference section 24, in addition to the components of the frequency modulation circuit shown in FIG. 1. While the frequency divider 300 divides the frequency of the clock signal CKSEL by 10, the frequency divider 302 divides the frequency of the clock signal CKSEL by 20, and both frequency dividers output the resultant signals to the selector 12.

The register 22 is accessible from an external central processing unit (CPU) 82 for read/write. The CPU 82 executes a software program designating an address in the register 22 and rewrites data in the register 22. The register 22 holds the rewritten data. The register reference section 24 outputs a signal of a logical level corresponding to information represented by "0" or "1" stored in a specific bit of the register 22 to the selector 12 as a selector switch signal DIVSEL.

The selector 12 selects either one of the signals output from the frequency dividers 300 and 302 according to the selector switch signal DIVSEL, and outputs the selected signal to the modulation control section 400 and also outputs outside the frequency modulation circuit 2000. In place of the CPU 82, a digital signal processor (DSP) or the like operating according to a software program may be used to rewrite the register 22.

In the circuit shown in FIG. 16, which has a plurality of frequency dividers, it is possible to select between a plurality of clock signals having different percentage modulations and frequencies and output the selected one, with a simple circuit configuration. The selector 12 is operated based on the information stored in the register 22. Therefore, the percentage modulation and frequency of the clock signal to be output can be selected by rewriting the data in the register 22 by software.

The selector switch signal DIVSEL may be supplied from outside the frequency modulation circuit 2000. In this case, the percentage modulation and frequency of the clock signal to be output can be changed according to the application used, and thus the degree of freedom of design increases.

Figure 17:
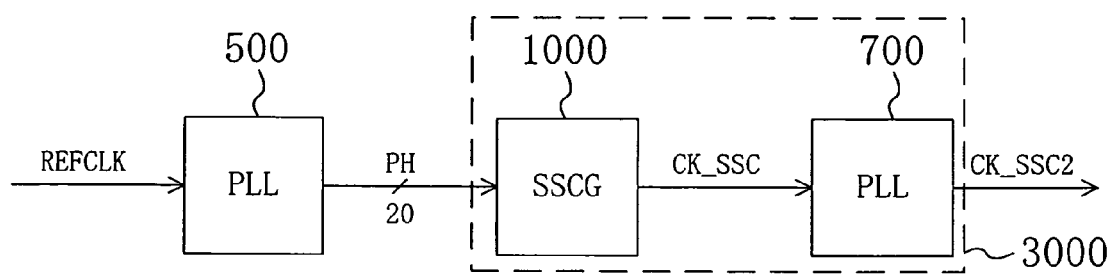
FIG. 17 is a block diagram showing yet another example of a frequency modulation circuit of the present invention.
Figure 18A:
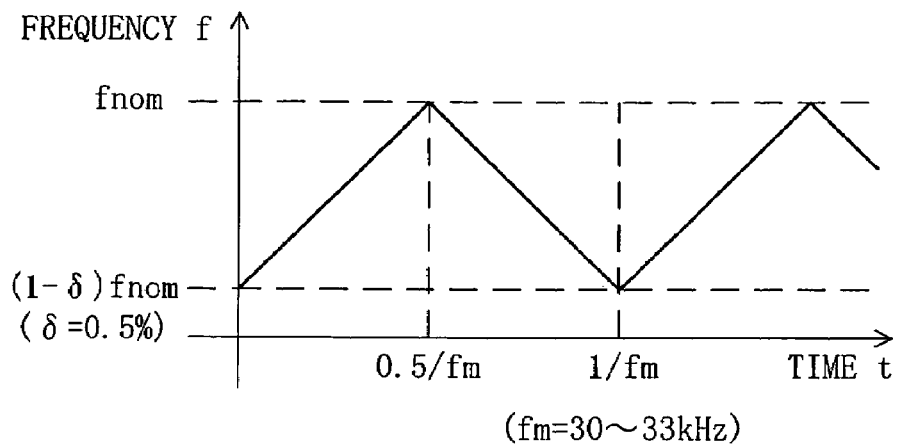
FIG. 18A is a graph showing a change in clock frequency under SSC in a Serial ATA standard.
Figure 18B:
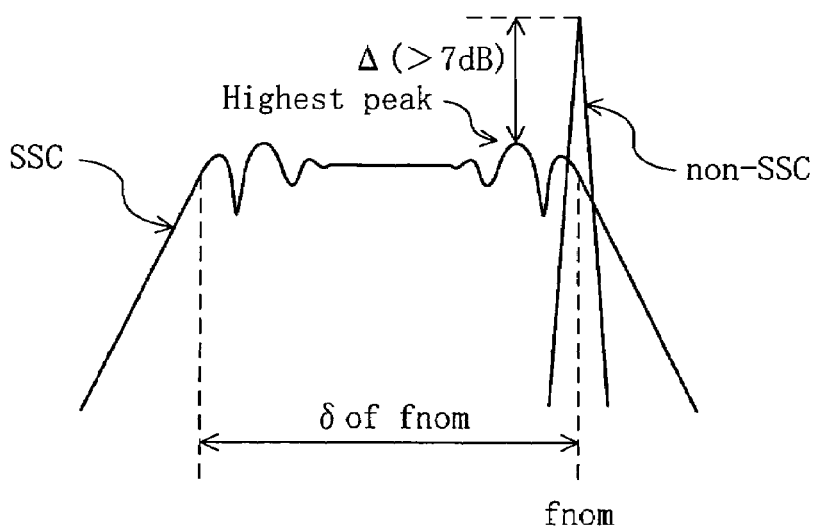
FIG. 18B shows a spectrum of a clock signal under SSC in the Serial ATA standard.
Figure 19:
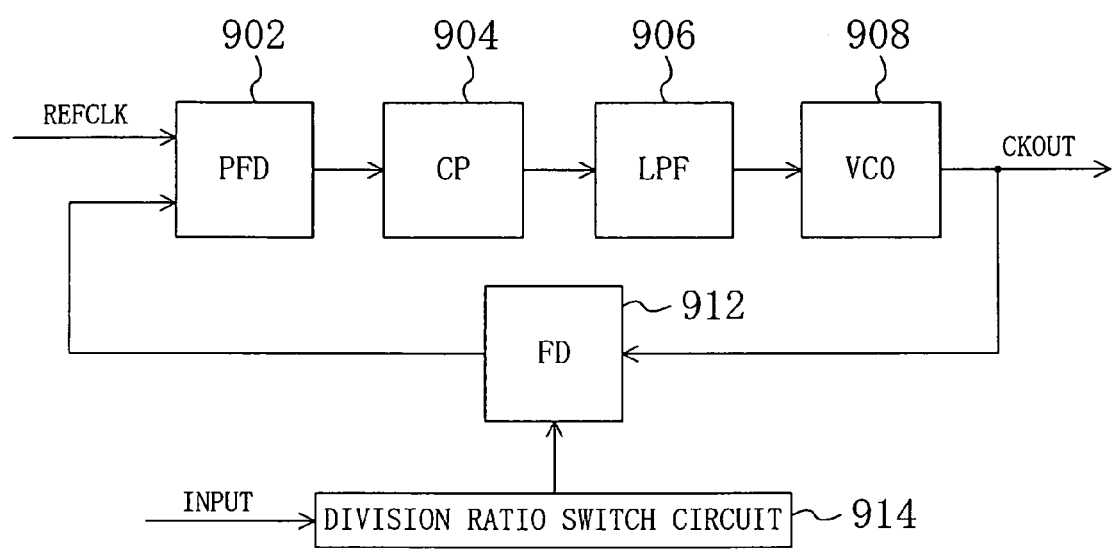
FIG. 19 is a block diagram of a frequency modulation circuit adopting the division ratio switch method.
Figure 20:
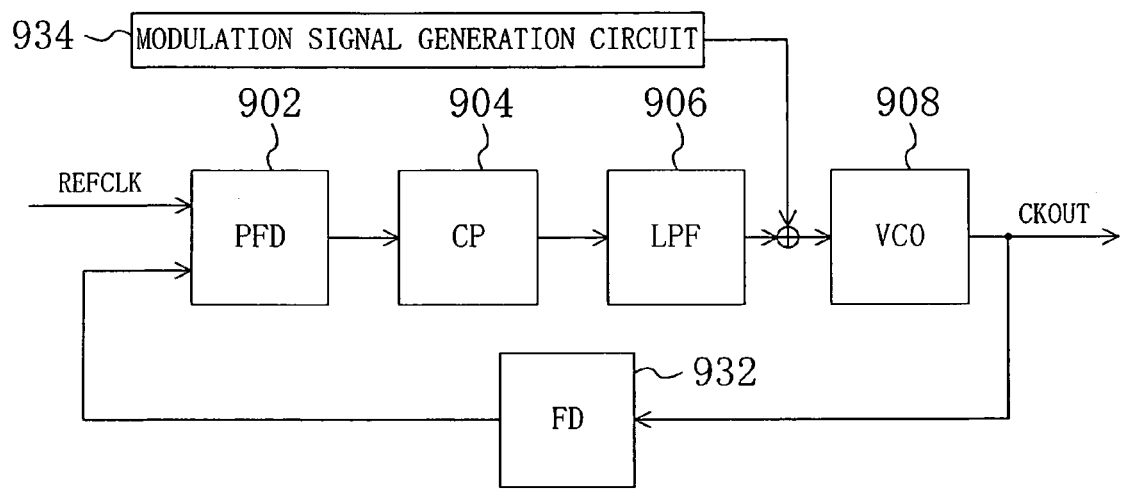
FIG. 20 is a block diagram of a frequency modulation circuit adopting the direct modulation method.

FIG. 17 is a block diagram showing yet another example of a frequency modulation circuit of the present invention. The frequency modulation circuit 3000 in FIG. 17 includes the frequency modulation circuit (SSCG) 1000 shown in FIG. 1 and a PLL 700. The PLL 500 and the frequency modulation circuit 1000 are the same as those described with reference to FIG. 1. The frequency modulation circuit 1000 generates the frequency-modulated 25 MHz clock signal CK_SSC and outputs the signal to the PLL 700. The PLL 700, having a known configuration, multiplies the frequency of the input clock signal CK_SSC by 60 to generate and output a clock signal CK_SSC2 having a frequency of 1.5 GHz.

The frequency modulation circuit 3000 in FIG. 17 can increase the frequency of the modulated clock signal, and this increases the general versatility and the degree of freedom of design. Since the PLL is provided downstream of the frequency modulation circuit 1000, the stepwise change of the frequency of the modulated clock signal CK_SSC can be filtered. When the resultant clock signal is used for an interface circuit of Serial ATA and the like, the connectivity of the entire interface improves.

In the embodiment described above, the differential/single-ended conversion section 160 was provided. However, when both the multiphase clocks input into the phase interpolation section 100 and the clock selection section 200 are differential signals or single-ended signals, it is unnecessary to provide the differential/single-ended conversion section 160.

As described above, the frequency modulation circuit of the present invention is useful for equipment requiring a frequency-modulated clock signal, and in particular, useful for interface equipment and the like based on Serial ATA standards in which frequency modulation with a small percentage modulation is required.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A frequency modulation circuit comprising:
   a phase shift section for receiving a multiphase clock signal composed of a plurality of clock signals having a predetermined phase difference therebetween, a frequency of the multiphase clock signal being substantially constant, shifting the phase of the multiphase clock signal, and outputting the resultant signal;
   a clock selection section for selecting a clock signal constituting the multiphase clock signal output from the phase shift section and outputting the selected signal; and
   a modulation control section for controlling the phase shift section and the clock selection section so that a frequency of the clock signal output from the clock selection section cyclically changes.

2. The frequency modulation circuit of claim 1, wherein the phase shift section shifts the phase of the input multiphase clock signal by interpolating a phase between clock signals constituting the multiphase clock signal.

3. The frequency modulation circuit of claim 2, wherein the phase shift section has a current source, and shifts the phase of the input multiphase clock signal according to the magnitude of a current flowing through the current source.

4. The frequency modulation circuit of claim 1, wherein the modulation control section operates according to a frequency-modulated clock signal.

5. The frequency modulation circuit of claim 4, wherein the modulation control section uses a signal based on the clock signal output from the clock selection section as the frequency-modulated clock signal.

6. The frequency modulation circuit of claim 1, further comprising a frequency divider for dividing the frequency of the clock signal output from the clock selection section and outputting the resultant signal.

7. The frequency modulation circuit of claim 6, wherein a plurality of frequency dividers are provided for dividing the frequency of the clock signal output from the clock selection section with different division ratios and outputting the resultant signals.

8. The frequency modulation circuit of claim 1, further comprising a phase locked loop receiving a signal based on the clock signal output from the clock selection section as an input.

9. The frequency modulation circuit of claim 1, wherein said modulation control section is adapted to control the phase shift section and the clock selection section so that a clock signal having a frequency different from the frequency of the multiphase clock signal input into the phase shift section is output from the clock selection section.

10. A frequency modulation circuit comprising:
    a phase shift section for receiving a multiphase clock signal composed of a plurality of clock signals having a predetermined phase difference therebetween, shifting the phase of the multiphase clock signal, and outputting the resultant signal;
    a clock selection section for selecting a clock signal constituting the multiphase clock signal output from the phase shift section and outputting the selected signal;
    a modulation control section for controlling the phase shift section and the clock selection section so that a freciuency of the clock signal output from the clock selection section cyclically changes;
    a frequency divider for dividing the frequency of the clock signal output from the clock selection section and outputting the resultant signal, wherein a plurality of frequency dividers are provided for dividing the frequency of the clock signal output from the clock selection section with different division ratios and outputting the resultant signals; and
    a selector for selecting one of the outputs of the plurality of frequency dividers according to a signal input from outside the frequency modulation circuit, and outputting the selected signal.

11. The frequency modulation circuit of claim 10, further comprising
    a register for holding a written value, wherein the selector selects one of the outputs of the plurality of frequency dividers based on the value in the register.

* * * * *

UNITED STATES PATENT AND TRADEMARK OFFICE
CERTIFICATE OF CORRECTION

PATENT NO. : 7,233,215 B2 Page 1 of 1
APPLICATION NO. : 11/000224
DATED : June 19, 2007
INVENTOR(S) : Tsuyoshi Ebuchi et al.

It is certified that error appears in the above-identified patent and that said Letters Patent is hereby corrected as shown below:

On the title page of the Letters Patent,

Item "(56) References Cited, FOREIGN PATENT DOCUMENTS", add
-- JP 2000-209033    09/2000 --

Signed and Sealed this

Fourth Day of December, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,233,215 B2 | Page 1 of 1 |
| APPLICATION NO. | : 11/000224 | |
| DATED | : June 19, 2007 | |
| INVENTOR(S) | : Tsuyoshi Ebuchi et al. | |

It is certified that error appears in the above-identified patent and that said Letters Patent is hereby corrected as shown below:

On the title page:

Under item "(56) References Cited, FOREIGN PATENT DOCUMENTS",
change "JP 2000-209033 9/2000" to -- JP 2000-209033 7/2000 --

Signed and Sealed this

Second Day of November, 2010

David J. Kappos
*Director of the United States Patent and Trademark Office*